US012628625B2

(12) United States Patent
Cheng et al.

(10) Patent No.: US 12,628,625 B2
(45) Date of Patent: May 12, 2026

(54) METHOD FOR FILLING GAP

(71) Applicant: TAIWAN SEMICONDUCTOR MANUFACTURING COMPANY, LTD., Hsinchu (TW)

(72) Inventors: Po-Hsien Cheng, Hsinchu (TW); Tai-Chun Huang, Hsinchu (TW); Chung-Ting Ko, Hsinchu (TW); Chia-Yu Fang, Hsinchu (TW); Sung-En Lin, Hsinchu (TW); Yu-Yun Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 436 days.

(21) Appl. No.: 18/464,993

(22) Filed: Sep. 11, 2023

(65) Prior Publication Data

US 2025/0087529 A1      Mar. 13, 2025

(51) Int. Cl.
H01L 21/762 (2006.01)
H01L 21/02 (2006.01)

(52) U.S. Cl.
CPC .... H01L 21/76224 (2013.01); H01L 21/0234 (2013.01); H01L 21/02345 (2013.01); H01L 21/02359 (2013.01); H01L 21/02274 (2013.01); H01L 21/0228 (2013.01)

(58) Field of Classification Search
None
See application file for complete search history.

(56) References Cited

U.S. PATENT DOCUMENTS

| | | | |
|---|---|---|---|
| 2009/0209083 A1* | 8/2009 | Chen | H01L 21/76224 |
| | | | 438/433 |
| 2018/0033689 A1* | 2/2018 | Anthis | H01L 21/76879 |
| 2021/0285102 A1* | 9/2021 | Yoon | H01L 21/0228 |
| 2023/0050255 A1* | 2/2023 | Zhao | C23C 16/56 |
| 2024/0194448 A1* | 6/2024 | Yeom | C23C 16/45538 |
| 2024/0234128 A1* | 7/2024 | Hatakeyama | H01L 21/0228 |
| 2024/0420950 A1* | 12/2024 | Ji | H01L 21/32137 |

* cited by examiner

*Primary Examiner* — Asok K Sarkar
(74) *Attorney, Agent, or Firm* — Birch, Stewart, Kolasch & Birch, LLP

(57) ABSTRACT

A method for filling a gap includes: filling a dielectric layer in the gap so that a seam is formed in the dielectric layer, the dielectric layer including two surface portions at two opposite sides of the seam, respectively; introducing a surface modification agent into the seam such that each of the two surface portions has first functional groups and second functional groups; forming a stress layer on the dielectric layer to cover the seam, the stress layer including a material different from that of the dielectric layer; and applying an energy field to permit the two surface portions to bond with each other through reaction between the first functional groups and the second functional groups.

20 Claims, 7 Drawing Sheets

100

METHOD FOR FILLING GAP

BACKGROUND

A gap-filling process for filling a conductive material or an insulating material in a gap is often repeatedly executed in the manufacturing process of a semiconductor device. With the size miniaturization of the semiconductor device, the gap-filling process is in continuous development so as to improve the performance of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
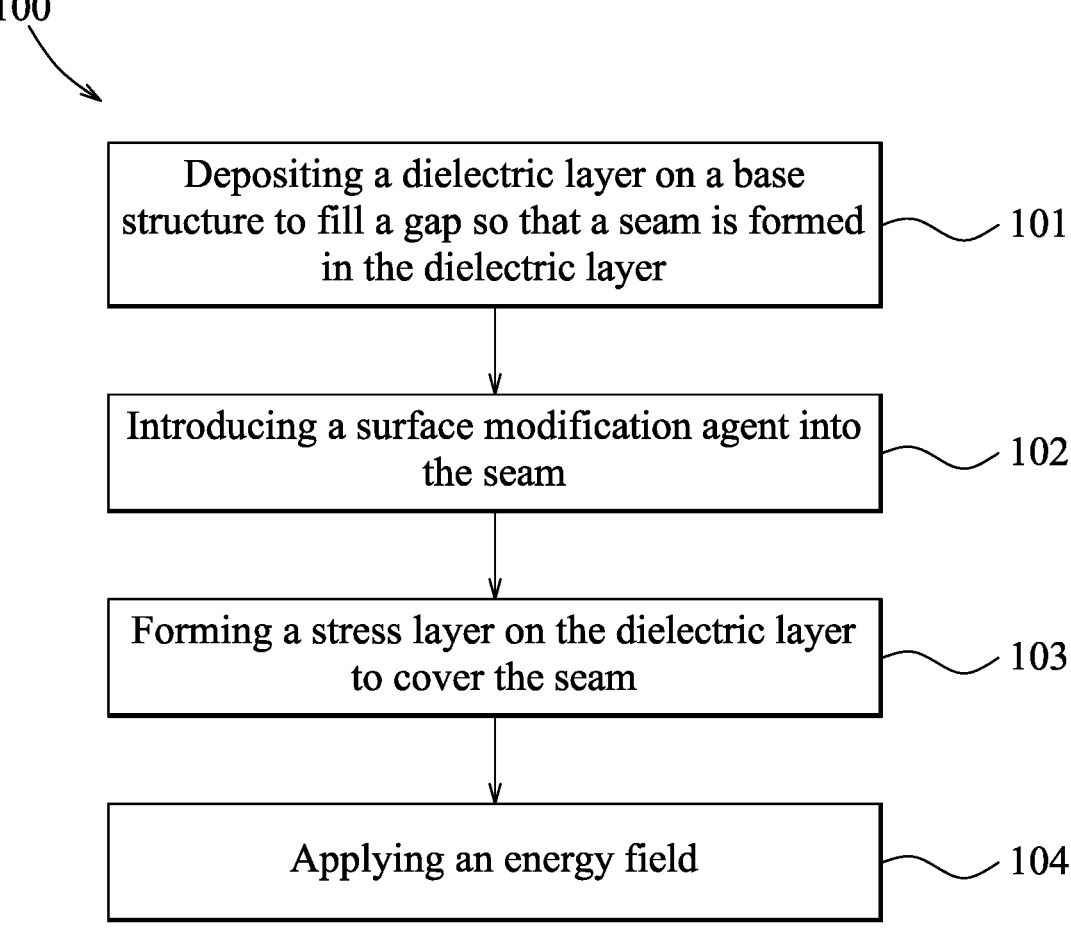
FIG. 1 is a flow diagram illustrating a method for filling a gap in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

In general, in the manufacturing process of a semiconductor device, a gap-filling dielectric material may be filled in a gap using a suitable deposition process, such as chemical vapor deposition, physical vapor deposition, or atomic layer deposition. In the case that the gap-filling dielectric material is filled in a gap which has a relatively high aspect ratio using flowable chemical vapor deposition, in order to improve the quality or density of the gap-filling dielectric material, a post-annealing process is typically performed at a temperature as high as 700° C. or even greater. Such post-annealing process is a relatively high thermal budget process. Under the relatively high thermal budget process, defects, such as copper out-diffusion, or germanium segregation (which may lead to increased channel resistance), may be formed in the semiconductor device. In the other case that the gap-filling dielectric material is filled in a gap having a relatively high aspect ratio using atomic layer deposition, a seam may be formed in the gap-filling dielectric material. When a conductive material is subsequently formed on such gap-filling dielectric material, the conductive material may penetrate into the seam, thereby causing a current leakage issue.

Therefore, the present disclosure is direct to a method for filling a gap using a gap-filling material which is substantially seamless in the gap. The method may be applied in many semiconductor manufacturing processes, such as processes for forming fin-type field-effect transistors (FinFETs), multi-gate field-effect transistors (e.g., gate-all-around field-effect transistors (GAAFETs), multi-bridge channel field-effect transistors (MBCFETs), fork-sheet field-effect transistors, a complementary field-effect transistor (CFET) structure including stacked transistors, other three-dimensional transistors, or other suitable devices. Exemplarily, the method may be used to fill a vertical gap to form a trench isolation (such as a shallow trench isolation (STI), a deep trench isolation (DTI), or the like) in a substrate for isolating two adjacent transistors from each other. The method may be further used in some processes which involve removing certain dummy gate structures, followed by refilling a dielectric material so as to form isolations for isolating different cells, or in some other processes which involve forming a gap in a semiconductor structure such that an active gate structure includes two parts separated by the gap, and refilling a dielectric material. The method may be also used to fill a lateral refilled material in lateral gaps. The lateral gaps may be used for forming multiple pairs of inner spacers for isolating two source/drain portions from a gate electrode in each of the transistors, or for forming a middle isolation located between the stacked transistors in the CFET structure. Other possible structures suitable to be formed by the method are within the contemplated scope of the present disclosure, and will be described hereinafter.

In this disclosure, when a seam is formed by depositing a dielectric layer in a gap, a surface modification agent may be introduced into the seam of the dielectric layer, followed by applying an energy field to permit occurrence of reaction inside the seam, thereby eliminating the seam originally present in the dielectric layer. Furthermore, the seamless dielectric layer may be formed by a relatively low thermal budget process, and thus a semiconductor device, which is made by processes such as the above low thermal budget process, may have reduced defects (e.g., copper out-diffusion, germanium segregation, current leakage, etc.) and may have better performance.

FIG. 1 is a flow diagram illustrating a method 100 for filling a gap with a dielectric layer in accordance with some embodiments. FIGS. 2 to 9 are schematic views illustrating intermediate stages of the method 100 in accordance with some embodiments. Some repeating structures are omitted in FIGS. 2 to 9 for the sake of brevity. Additional steps can be provided before, after or during the method 100, and some of the steps described herein may be modified, replaced by other steps or be eliminated without departure from the spirit and scope of the present disclosure.

Figure 2:
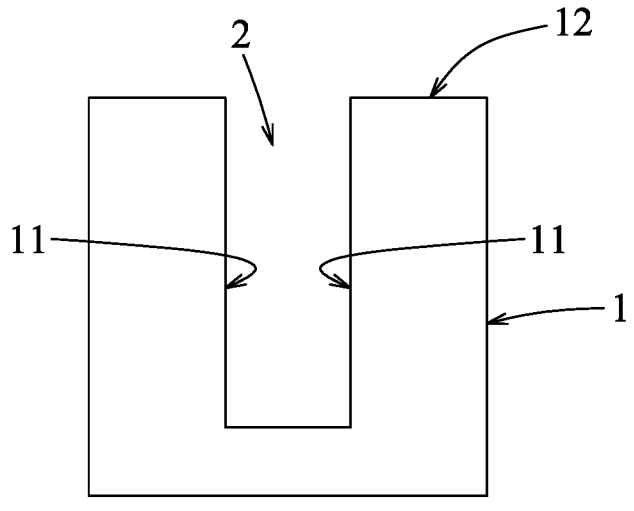
FIGS. 2 to 9 are schematic views illustrating intermediate stages of the method depicted in FIG. 1 in accordance with some embodiments.
Figure 3:
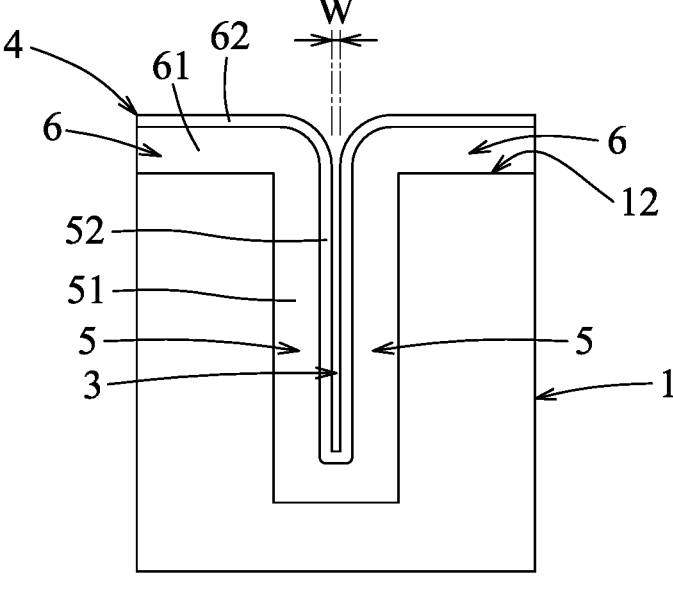

Referring to FIG. 1 and the examples illustrated in FIGS. 2 and 3, the method 100 begins at step 101, where a dielectric layer 4 is deposited on a base structure 1 to fill a gap 2 in the base structure 1.

In some embodiments, the dimension of the gap 2 and the material(s) of the base structure 1 may vary according to practical applications. For example, but not limited to, the base structure 1 may be a silicon substrate, and the gap 2 is formed in the silicon substrate for forming a shallow trench isolation subsequently.

In some embodiments, possible dielectric materials suitable for the dielectric layer 4 include silicon oxide, silicon nitride, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof. In some embodiments, the dielectric layer 4 may be deposited on the base structure 1 using thermal atomic layer deposition, plasma enhanced atomic layer deposition, or other types of atomic layer deposition. Different types and/or states of precursor(s) may be utilized in the thermal atomic layer deposition and the plasma-enhanced atomic layer deposition. For example, water steam is used as the precursor for providing oxygen in thermal atomic layer deposition, and oxygen plasma (which is generated from oxygen gas) is used as the precursor for providing oxygen in plasma-enhanced atomic layer deposition.

In general, atomic layer deposition is performed at a relatively low pressure ranging from about 0.5 torr to about 30 torr. Deposition of the dielectric layer 4 using atomic layer deposition includes a plurality of deposition cycles. In each deposition cycle, an atomic layer (e.g., an atomic layer of silicon, an atomic layer of boron, an atomic layer of metal, an atomic layer of oxygen, an atomic layer of nitrogen, or the like) of the dielectric layer 4 is deposited on the base structure 1 and in the gap 2.

Each of the deposition cycles includes a first reaction step and a second reaction step. In the first reaction step, a first precursor is delivered into a reaction chamber which is previously evacuated. The first precursor includes silicon, boron or a metal element for forming the dielectric layer 4. In the first reaction step, the first precursor is absorbed on the base structure 1, and is reacted with, for example, but not limited to, hydroxyl groups of the base structure 1 to result in formation of a first atomic layer of silicon, boron or a metal element on the base structure 1 and formation of gaseous by-products (e.g., methane, hydrogen chloride, or other possible by-products depending on the reaction between the first precursors and the base structure 1). Before proceeding to the second reaction step, the unreacted first precursor and the gaseous by-products resulted in the first reaction step are purged out of the reaction chamber.

Afterwards, in the second reaction step, a second precursor is delivered into the reaction chamber. The second precursor is a source of oxygen, nitrogen or carbon for forming the dielectric layer 4. For example, the second precursor may include water steam, ozone gas, or oxygen plasma for providing oxygen; ammonia plasma or a plasma mixture of hydrogen and nitrogen for providing nitrogen; or a hydrocarbon plasma for providing provide carbon. In the second reaction step, the second precursor is absorbed on the first atomic layer, and the second precursor is reacted with the first atomic layer to result in formation of a second atomic layer of oxygen, nitrogen or carbon on the first atomic layer and formation of gaseous by-products (e.g., methane, hydrogen chloride, gaseous water, carbon dioxide, or other possible by-products depending on the reaction between the second precursor and the first atomic layer). The second atomic layer may be terminated with an —OH group, an —NH$_2$ group, an —NH group, or other suitable functional groups. Before proceeding to the next step, the unreacted second precursor and the gaseous by-products resulted in the second reaction step are purged out of the reaction chamber. As the first and second reaction steps are alternately performed, the thickness of the dielectric layer 4 increases layer by layer.

When the dielectric layer 4 is filled in the gap 2 layer by layer through atomic layer deposition, each of the atomic layers is deposited in the gap 2 conformally, leaving a remaining space to be filled subsequently by the next atomic layer. When the remaining space is not enough for diffusion of the precursor of the next reaction step (the first or second reaction step) into the space to react with the previously formed atomic layer, atomic layer deposition of the dielectric layer 4 stops automatically. Consequently, a seam 3 is formed in the dielectric layer 4.

In some embodiments, as shown in FIG. 3, the dielectric layer 4 includes two inner regions 5 and two outer regions 6. The inner regions 5 are filled in the gap 2 to respectively cover two inner surfaces 11 (see FIG. 2) that border the gap 2. The two outer regions 6 respectively extend from outer ends of the inner regions 5 to cover on an outer surface 12 (see also FIG. 2) of the base structure 1. Each of the inner regions 5 includes a main portion 51 and a surface portion 52 disposed between the main portion 51 and the base structure 1. Each of the outer regions 6 includes a main portion 61 and a surface portion 62 disposed between the main portion 61 and the base structure 1. The surface portions 52 of the inner regions 5 are located at two opposite sides of the seam 3, respectively. In some embodiments, the seam 3 has a width (W) between the two surface portions 52 ranging from about 5 Å to about 1 nm. Other suitable processes for forming the dielectric layer 4 are within the contemplated scope of the present disclosure.

Figure 4:
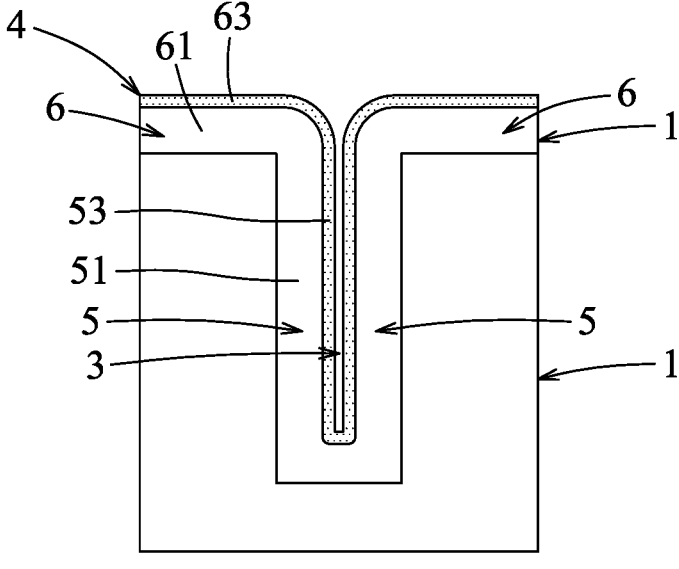

Referring to FIG. 1 and the example illustrated in FIG. 4, the method 100 proceeds to step 102, where a surface modification agent is introduced into the seam 3 so that each of the surface portions 52 of the inner regions 5 are modified to have first functional groups and second functional groups. Hereinafter, the modified surface portions of the inner regions 5 are denoted by the numeral 53. In some embodiments, both the first and second functional groups are hydroxyl groups (—OH groups). In some alternative embodiments, the first functional groups are —NH$_x$ groups, where x is 1 or 2, and the second functional groups are —H groups.

In some embodiments, the surface modification agent includes gas molecules having a molecular size less than the width (W) of the seam 3, and is introduced into the seam 3 by immersing the dielectric layer 4 in the atmosphere of the gas molecules. In some embodiments, the dielectric layer 4 is immersed in the atmosphere of the gas molecules at a pressure ranging from about 1 atm to about 10 atm and at a temperature ranging from room temperature to about 450° C. for a time period ranging from about 1 minutes to about 10 minutes. In some embodiments, the gas molecules include water steam, hydrogen peroxide, ammonia, or hydrazine. Since the gas molecules have a relatively small molecular size and since the gas molecules are introduced at a relatively high pressure that is higher than a pressure used in the atomic layer deposition performed in step 101, the gas molecules are capable of diffusing into the seam 3 to react with the two surface portions 52 (see FIG. 3), so that the chemical properties of the two surface portions 52 can be altered. It is noted that since the two surface portions 62 (see FIG. 3) of the outer regions 6 are also exposed to the atmosphere of the gas molecules in step 102, the gas molecules also react with the surface portions 62 of the outer portions 6. As such, the surface portions 62 of the outer regions 6 are also modified to have the first and second functional groups, and the modified surface portions of the outer regions 6 are denoted by the numeral 63.

In some alternative embodiments, the surface modification agent includes a plasma. That is, the dielectric layer 4 may be treated by a plasma treatment using the plasma. A precursor gas for generating the plasma includes ammonia gas, oxygen gas, a gas mixture of nitrogen and hydrogen, or a gas mixture of hydrogen and oxygen. In some embodiments, the dielectric layer 4 may be treated at a pressure ranging from about 0.5 torr to about 50 torr and at a temperature ranging from about room temperature to about 450° C. for a time period ranging from about 2 seconds to about 360 seconds.

FIGS. 10 to 13 are schematic diagrams illustrating changes in chemical bonds on the two surface portions of the inner regions 5 (see also FIGS. 3, 4 and 8) at different stages of the method in accordance with different embodiments.

Figures 10, 11:
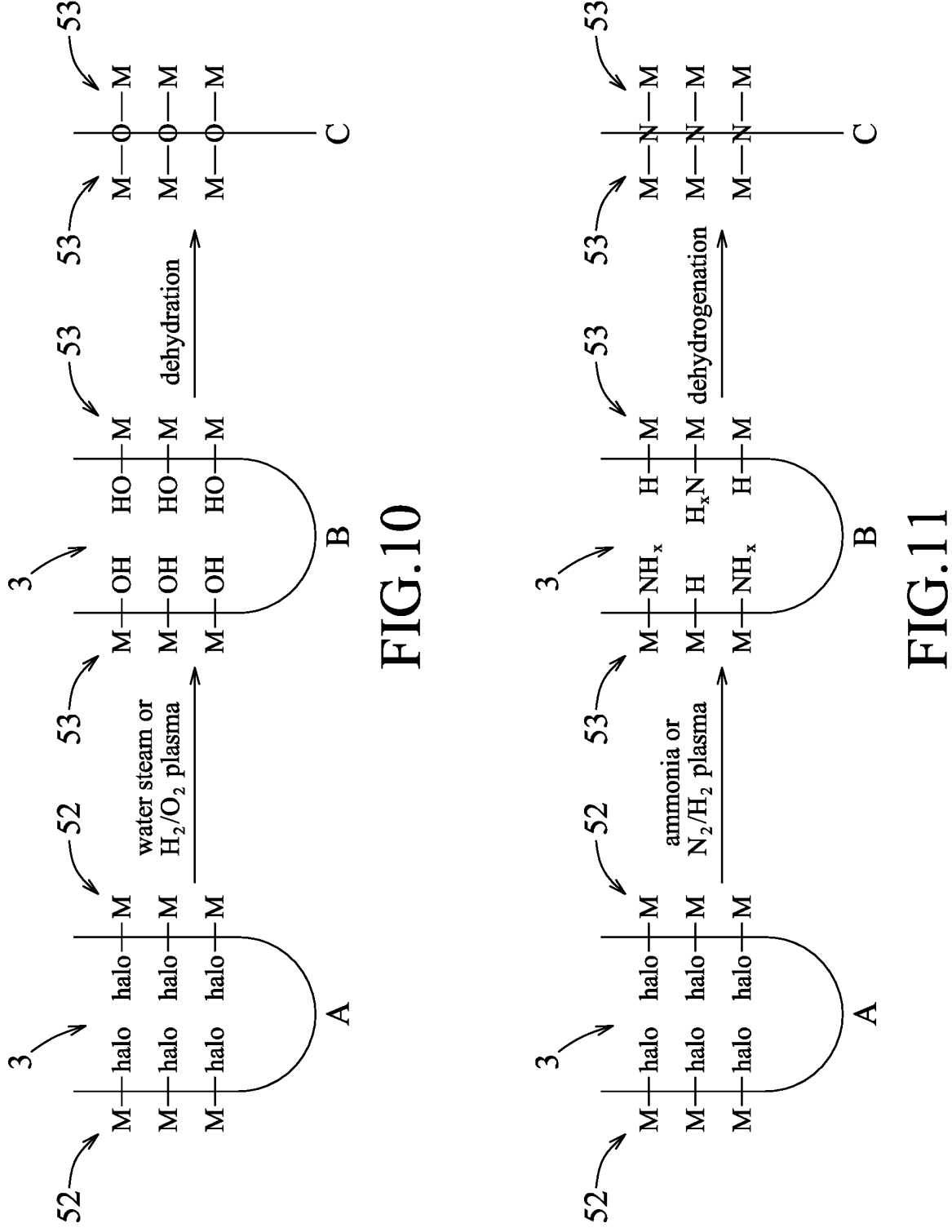
FIGS. 10 to 13 are schematic diagrams illustrating changes in chemical bonds on two surface portions of a dielectric layer at different stages of the method in accordance with different embodiments.

Referring to FIG. 10, in stage A (i.e., step 101), the dielectric layer 4 is formed using the first precursor which includes halogens, the two surface portions 52 obtained after atomic layer deposition in step 101 may be formed with M-halo bonds, where M is silicon, boron or a metal element (such as zirconium, titanium, hafnium, or other suitable metal elements), and halo is fluoro, chloro, bromo, or iodo. In some embodiments, for example, the first precursor may be bis(dischlorosily) methane or dichlorosilane for forming a silicon-based dielectric layer, boron trichloride for forming a boron-based dielectric layer, zirconium chloride for forming a zirconium-based dielectric layer, titanium chloride for forming a titanium-based dielectric layer, or hafnium chloride for forming a hafnium-based dielectric layer.

Afterwards, when proceeding to step 102, the two surface portions 52 may be immersed in the atmosphere of water steam (or hydrogen peroxide) at a pressure ranging from about 1 atm to about 10 atm and at a temperature ranging from about room temperature to about 150° C. for a time period ranging from about 1 minutes to about 10 minutes. Referring to FIG. 10, in stage B (i.e., step 102), after water steam (or hydrogen peroxide) reacts with halo groups (e.g., chloro groups (—Cl)), M-OH bonds are formed on the two surface portions 53, and meanwhile, hydrogen halide (for example, but not limited to, hydrochloric acid (HCl)), which is a by-product of the reaction, is vaporized or removed through the seam 3. The aforesaid process for substituting halo groups with hydroxyl groups (—OH) may be referred to as surface oxidation. That is, in the embodiment illustrated by FIG. 10, both the first and second functional groups are —OH groups.

In some alternative embodiments, M-halo bonds (e.g., M-Cl bonds) may be converted into M-OH bonds by performing a plasma treatment in which a gas mixture of hydrogen and oxygen is used as the precursor gas to generate the plasma. In some embodiments, process parameters (e.g., pressure, temperature, and time period, etc.) of the plasma treatment are similar to those as described above with reference to FIG. 4, and may be adjusted according to practical needs. For example, a temperature of the plasma treatment for converting M-halo bonds into M-OH bonds may range from about room temperature to about 150° C. Gaseous by-products (e.g., hydrochloric acid) generated during the plasma treatment are vaporized or removed through the seam 3.

FIG. 11 is a graph similar to FIG. 10, but in stage B (i.e., step 102), M-halo bonds on the two surface portions 52 in stage A are converted into M-NH$_x$ bonds and M-H bonds, where x is 1 or 2.

In this case, the dielectric layer 4 is formed in stage A (i.e., step 101) using a manner similar to that for forming the dielectric layer 4 as described above with reference to FIG. 10, but the two surface portions 52 are immersed in the atmosphere of ammonia (or hydrazine) at a pressure ranging from about 1 atm to about 10 atm and at a temperature ranging from about 300° C. to about 450° C. for a time period ranging from about 1 minutes to about 10 minutes. Referring to FIG. 11, in stage B (i.e., step 102), after ammonia (or hydrazine) reacts with the halo groups (e.g., chloro groups (—Cl)), M-NH$_x$ bonds and M-H bonds are formed on the two surface portions 53, and meanwhile, hydrogen halide (e.g., hydrochloric acid (HCl)), which is a by-product obtained in stage B (i.e., step 102), is vaporized or removed through the seam 3. In some embodiments, the aforesaid process for substituting halo groups with the —NH$_x$ groups and hydrogen groups (—H) may be referred to as surface nitridation. The —NH$_x$ groups may include-NH groups and/or —NH$_2$ groups. In the embodiment illustrated by FIG. 11, the first functional groups are —NH$_x$ groups, and the second functional groups are —H groups.

In some alternative embodiments, M-halo bonds may be converted into M-NH$_x$ bonds and M-H bonds by performing a plasma treatment in which a gas mixture of nitrogen and hydrogen is used as the precursor gas to generate the plasma. In some embodiments, process parameters (e.g., pressure, temperature, and time period, etc.) of the plasma treatment are similar to those as described above with reference to FIG. 4, and may be adjusted according to practical needs. For example, a temperature of the plasma treatment for converting M-halo bonds into M-NH$_x$ bonds and M-H bonds may range from about 300° C. to about 450° C. Gaseous by-products (e.g., hydrochloric acid) generated during the plasma treatment are vaporized or removed through the seam 3.

Figures 12, 13:
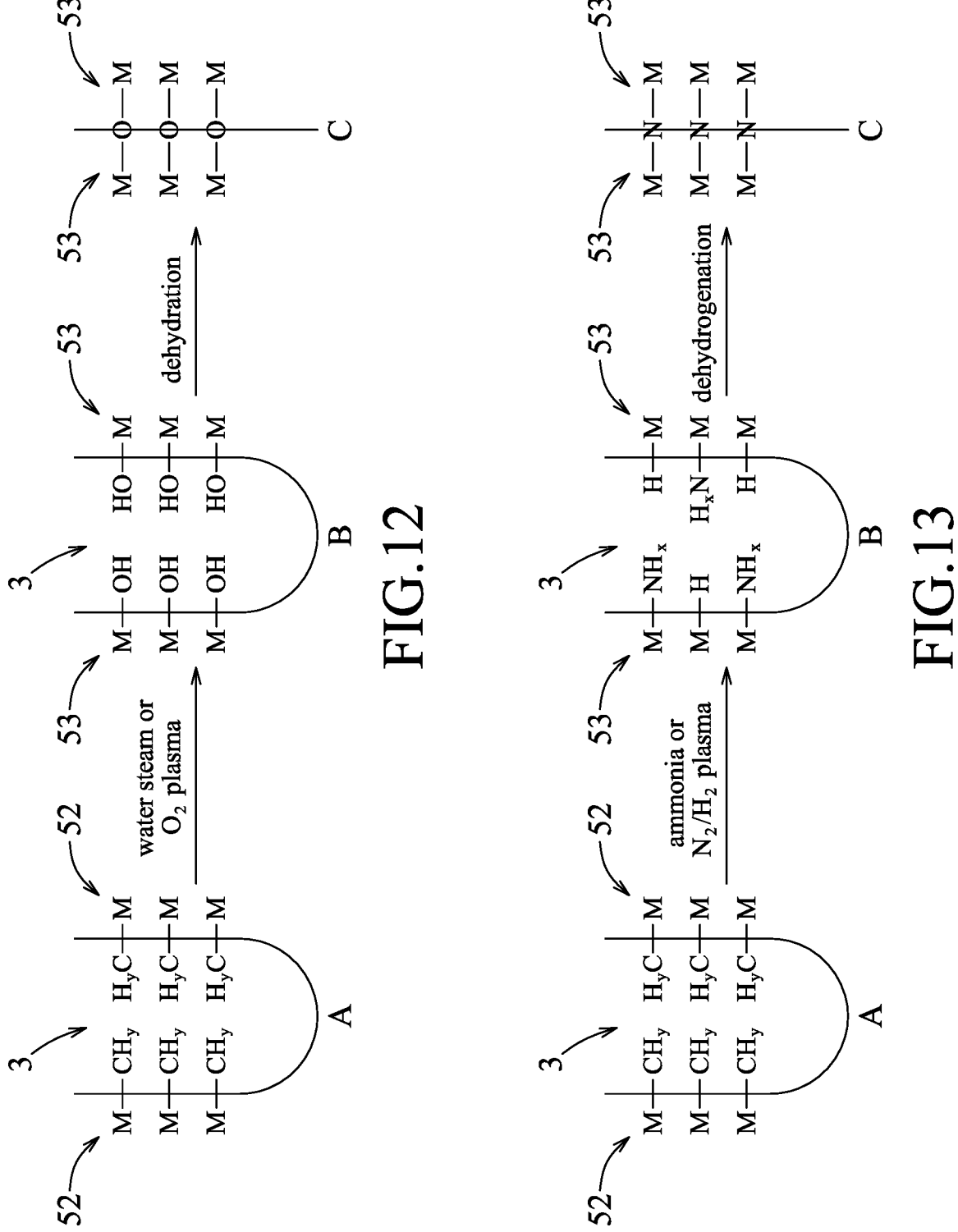

FIG. 12 is a graph similar to FIG. 10, but the two surface portions 52 obtained in the atomic layer deposition in step 101 (i.e., stage A) are formed with M-CH$_y$ bonds, where y is 1, 2 or 3. This is because, in the embodiment illustrated by FIG. 12, the dielectric layer 4 is formed in step 101 using the first precursor including hydrocarbon radicals (—CH$_y$). In some embodiments, for example, the first precursor used in the atomic layer deposition in step 101 may be tetrakis (ethylmethylamino) zirconium for forming zirconium-based dielectric layer, tetrakis(dimethylamino) titanium for forming a titanium-based dielectric layer, tetrakis(dimethylamino) hafnium for forming a hafnium-based dielectric layer, or tetramethyl aluminum for forming an aluminum-based dielectric layer.

Afterwards, when proceeding to step 102, the two surface portions 52 are immersed in the atmosphere of water steam (or hydrogen peroxide) at a pressure ranging from about 1 atm to about 10 atm and at a temperature ranging from about room temperature to about 150° C. for a time period ranging from about 1 minutes to about 10 minutes. Referring to FIG. 12, in stage B (i.e., step 102), after water steam (or hydrogen peroxide) reacts with the hydrocarbon groups (—CH$_y$) on the two surface portions 52, M-OH bonds are formed on the two surface portions 53, and meanwhile, by-products (for example, but not limited to, methane (CH$_4$)) are vaporized or removed through the seam 3. That is, in the embodiment illustrated by FIG. 12, both the first and second functional groups are —OH groups.

In some alternative embodiments, M-CH$_y$ bonds may be converted into M-OH bonds by performing a plasma treatment in which oxygen gas is used as the precursor gas to generate the plasma. In some embodiments, process parameters (e.g., pressure, temperature, and time period, etc.) of the plasma treatment are similar to those as described above with reference to FIG. 4, and may be adjusted according to practical needs. For example, a temperature of the plasma treatment for converting M-CH$_y$ bonds into M-OH bonds may range from about room temperature to about 150° C. Gaseous by-products (e.g., carbon dioxide and gaseous water) generated during the plasma treatment are vaporized or removed through the seam 3.

FIG. 13 is a graph similar to FIG. 12, but M-CH$_y$ bonds on the two surface portions 52 in stage A (i.e., step 101) are converted into M-NH$_x$ bonds and M-H bonds in stage B (i.e., step 102).

In this case, the dielectric layer 4 is formed in step 101 (i.e., stage A) in a manner similar to that for forming the dielectric layer 4 as described above with reference to FIG. 12, but the two surface portions 52 are immersed in the atmosphere of ammonia (or hydrazine) at a pressure ranging from about 1 atm to about 10 atm and at a temperature ranging from about 300° C. to about 450° C. for a time period ranging from about 1 minutes to about 10 minutes. Referring to FIG. 13, in stage B (i.e., step 102), after ammonia (or hydrazine) reacts with the hydrocarbon bonds (—CH$_y$), M-NH$_x$ bonds and M-H bonds are formed on the two surface portions 53, and meanwhile, by-products (e.g., methane) are vaporized or removed through the seam 3. That is, in the embodiment illustrated by FIG. 13, the first functional groups are —NH$_x$ groups, and the second functional groups are —H groups.

In some alternative embodiments, M-CH$_y$ bonds may be converted into M-NH$_x$ bonds and M-H bonds by performing a plasma treatment in which a gas mixture of nitrogen and hydrogen is used as the precursor gas for generating the plasma. In some embodiments, process parameters (e.g., pressure, temperature, and time period, etc.) of the plasma treatment are similar to those as described above with reference to FIG. 4, and may be adjusted according to practical needs. For example, a temperature of the plasma treatment for converting M-CH$_y$ bonds into M-NH$_x$ bonds and M-H bonds may range from about 300° C. to about 450°

C. Gaseous by-products (e.g., methane) generated during the plasma treatment are vaporized or removed through the seam 3.

It is worth noting that, through selection of the surface modification agent in step 102 (i.e., stage B), in some embodiments illustrated by FIGS. 10 and 12, the modified surface portions 53, as well as the modified surface portions 63 (see FIG. 4), have M-OH bonds; while in some other embodiments illustrated by FIGS. 11 and 13, the modified surface portions 53, as well as the modified surface portions 63 (see FIG. 4), have M-NH$_x$ bonds and M-H bonds. Other suitable processes for modifying the surface portions 52 are within the contemplated scope of the present disclosure.

Figure 5:
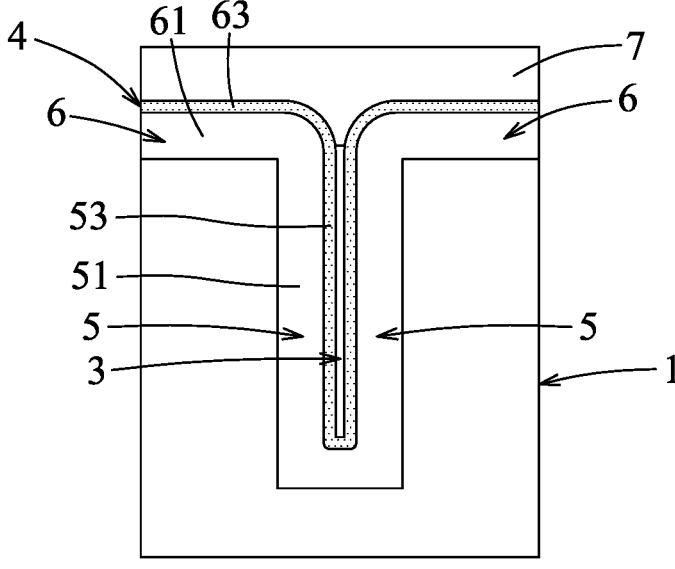

Referring to FIG. 1 and the example illustrated in FIG. 5, the method 100 proceeds to step 103, where a stress layer 7 is formed on the dielectric layer 4 to cover the seam 3. In some embodiments, the stress layer 7 is formed on the outer regions 6 of the dielectric layer 4 to cover the seam 3. It is noted that after step 103, the first and second functional groups on the surface portions 52 are substantially not changed and may be also represented by those in stage B of FIG. 10, 11, 12, or 13.

The stress layer 7 includes a material different from that of the dielectric layer 4. In some embodiments, the stress layer 7 includes amorphous silicon, silicon oxide, silicon nitride, silicon carbide, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof. In some embodiments, the stress layer 7 has a coefficient of thermal expansion different from that of the dielectric layer 4 such that a stress is generated between the stress layer 7 and the dielectric layer 4. Specifically, the stress layer 7 is formed on the dielectric layer 4 using a suitable deposition technique (for example, but not limited to, chemical vapor deposition, physical vapor deposition, or atomic layer deposition). When the stress layer 7 is just deposited on the dielectric layer 4, both the stress layer 7 and the dielectric layer 4 are at a deposition temperature that is higher than room temperature. Then, both the stress layer 7 and the dielectric layer 4 may shrink in volume during cooling of the same. Since the coefficient of thermal expansion of the stress layer 7 is different from that of the dielectric layer 4, the shrinkage in volume of the stress layer 7 is different from that of the dielectric layer 4. Therefore, the stress between the stress layer 7 and the dielectric layer 4 is generated.

Figure 6:
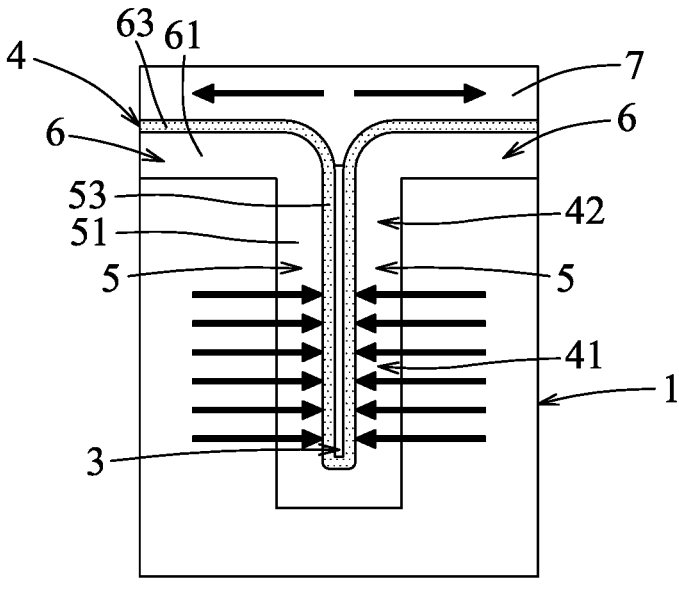
Figure 7:
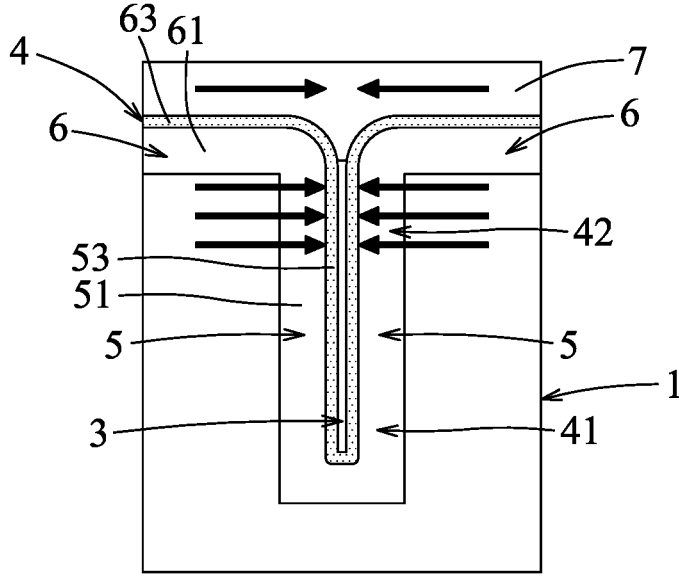

FIGS. 6 and 7 are schematic views similar to FIG. 5 but further illustrating the stress between the stress layer 7 and the dielectric layer 4 in accordance with different embodiments.

In some embodiments, as shown in FIG. 6, the dielectric layer 4 in the gap 2 (see FIG. 2) includes a deeper part 41 and a shallower part 42. In the case that the coefficient of thermal expansion of the dielectric layer 4 is greater than that of the stress layer 7, the shrinkage of the dielectric layer 4 is greater than that of the stress layer 7, and the stress layer 7 is forced by the dielectric layer 4 to overly shrink. Accordingly, compared to the shallower part 42 proximate to the stress layer 7, the deeper part 41 distal from the stress layer 7 shrinks at a relatively large degree (i.e., the deeper part 41 is subjected to a relatively large compressive stress). Therefore, portions of the inner regions 5 at the deeper part 41 may be brought closer to each other.

In some embodiments, as shown in FIG. 7, in the case that the coefficient of thermal expansion of the stress layer 7 is greater than that of the dielectric layer 4, the shrinkage of the stress layer 7 is greater than that of the dielectric layer 4, and the dielectric layer 4 is forced by the stress layer 7 to overly shrink. Accordingly, compared to the deeper part 41, the shallower part 42 shrinks at a relatively large degree (i.e., the shallower part 42 is subjected to a relatively large compressive stress). Therefore, portions of the inner regions 5 at the shallower part 42 may be brought closer to each other. Other suitable processes for applying a compressive stress to the dielectric layer 4 are within the contemplated scope of the present disclosure.

Figure 8:
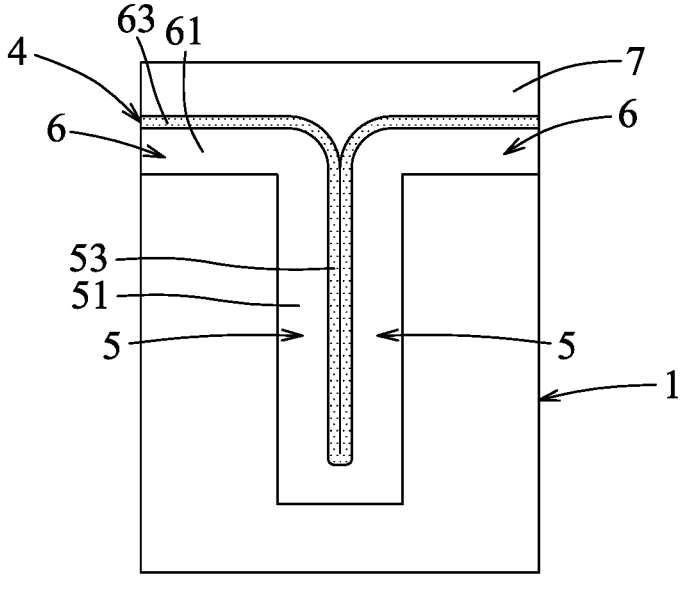

Referring to FIG. 1 and the example illustrated in FIG. 8, the method 100 proceeds to step 104, where an energy field is applied to permit reaction of the first and second functional groups of the two surface portions 53 of the inner regions 5, thereby bonding the two surface portions 53 together.

In some embodiments, the energy field is performed by applying an electromagnetic field with a selective frequency such that the first and second functional groups of the two surface portions 53 are capable of reacting with each other.

In some embodiments, the selective frequency ranges from about 100 kHz to about 100 GHz. In some embodiments, the electromagnetic field may be applied with a power ranging from about 1500 W to about 10000 W for a time period ranging from about 10 seconds to about 30 minutes. Under the electromagnetic field with the selective frequency, M-OH bonds, M-NH$_x$ bonds and/or M-H bonds on the two surface portions 53 are driven to rotate, so as to permit the two surface portions 53 to be selectively heated up and to react with each other.

Referring to stage B (i.e., steps 102 and 103) and stage C (i.e., step 104) in FIGS. 10 and 12, as the surface portions 53 are selectively heated under the electromagnetic field with the selective frequency, a dehydration reaction occurs to remove water molecules from the M-OH bonds respectively on the two surface portions 53, to thereby form M-O-M bonds (where M is silicon or a metal element, and O is oxygen) in stage C. The water molecules may vaporize and/or be removed from the seam 3, and finally, the two surface portions 53 are seamlessly bonded together by M-O-M bonds.

Referring to stage B (i.e., steps 102 and 103) and stage C (i.e., step 104) in FIGS. 11 and 13, as the surface portions 53 are selectively heated under the electromagnetic field with the selective frequency, a dehydrogenation reaction occurs to remove hydrogen gas from M-NH$_x$ bonds on one of the surface portions 53 and M-H bonds on another one of the surface portions 53, to thereby form M-N-M bonds (where M is silicon or a metal element, and N is nitrogen). The hydrogen gas may be removed from the seam 3, and finally, the two surface portions 53 are seamlessly bonded together by M-N-M bonds.

With the provision of the electromagnetic field is applied with the selective frequency, the surface portions 53 are selectively heated. Hence, a temperature at the surface portions 53 is higher than a temperature at other portions (such as the stress layer 7, the base structure 1, and the main portions 51, 61). In some embodiments, during application of the electromagnetic field, the base structure 1 may be detected to have a temperature ranging from 400° C. to 650° C. It is believed that the temperature at the two surface portions 53 may be higher than the temperature detected at the base structure 1.

In some embodiments, the electromagnetic field may be applied intermittently (i.e., a pulsed electric field) with a plurality of pulsing cycles. By controlling parameters (e.g., a number of the pulsing cycles, a duty-on time period per pulsing cycle, and so on) of the pulsed electric field, during formation of M-O-M bonds or M-N-M bonds, the temperature detected at the base structure 1 may be further reduced. In some embodiments, each of the pulsing cycle may have a pulsing power ranging from about 1500 W to about 10000 W. In some embodiments, the number of the pulsing cycles may range from about 1 to about 30. Each of the pulsing cycles includes a duty-on step and a duty-off step. In some embodiments, the total time period of the duty-on steps may be about 10% to about 90% based on the total time period of application of the electromagnetic field. Other suitable processes for selectively heating the surface portions 53 are within the contemplated scope of the present disclosure.

To keep the stress generated between the stress layer 7 and the dielectric layer 4, the surface portions 53 are selectively heated using the electromagnetic field with the selective frequency, instead of heating the whole structure. As such, when the surface portions 53 are reacted to form M-O-M bonds or M-N-M bonds, the compressive stress can be continuously applied to the deeper part 41 or the shallower part 42 of the dielectric layer 4. With the application of the compressive stress, M-O-M bonds or M-N-M bonds may be formed at a reduced temperature. As such, undesirable diffusion in the base structure 1 may be avoided. In some embodiments, step 103 may be omitted, that is, the stress layer 7 is not formed on the dielectric layer 4 to cover the seam 3. In this case, formation of M-O-M bonds or M-N-M bonds will be carried out at a relatively higher temperature. In some embodiments, the temperature of the base structure 1 without the stress layer 7 may range from about 50° C. to about 100° C. higher than that of the based structure 1 with the stress layer 7.

Figure 9:
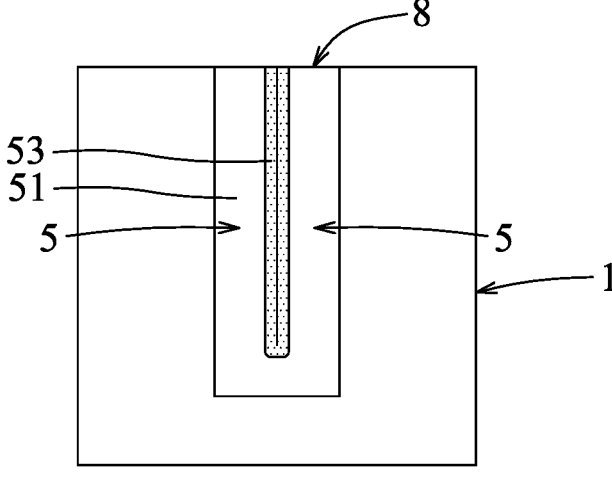

In some embodiments, after application of the electromagnetic field, the method 100 may proceed to a step of removing the stress layer 7 in accordance with some embodiments. In some embodiments, as shown in FIG. 9, the stress layer 7 may be removed to expose the base structure 1 by performing a planarization process, such as chemical mechanical polishing, or a suitable etching process, such as a dry etching and/or a wet etching process. Consequently, the gap 2 (see FIG. 2) is seamlessly filled by the dielectric layer 4 (see FIG. 8) to form a dielectric structure 8.

Please note that the aforementioned method, which is used to fill the gap 2 that is elongated in the base structure 1 in a vertical direction, is merely an example to demonstrate the gap filling method of the present disclosure. The gap filling method may also be applied to fill a gap which is elongated in a horizontal direction that is transverse to the vertical direction. In some embodiments, a vertical gap may be filled using the aforementioned method to form a continuous poly-on-diffusion-edge (CPODE) pattern for isolating two adjacent transistors spaced apart from each other in an X direction. In some other embodiments, a vertical gap may be filled using the aforementioned method to from a cut-metal-gate (CMG) plug for separating metal gates of two adjacent transistors from each other in a Y direction transverse to the X direction. In some still other embodiments, a vertical gap may be filled using the aforementioned method to form a dielectric wall for separating channel portions of two adjacent transistors in a fork-sheet structure. In some yet other embodiments, a horizontal gap may be filled to form a middle isolation for separating channel portions of two adjacent transistors stacked on each other in a Z direction transverse to the X and Y directions. The method of the present disclosure may be applied in any other suitable applications in the fabrication of semiconductor structures, especially when the gap filling method is required to be conducted at low temperature condition.

The embodiments of the present disclosure have the following advantageous features. With inclusion of the surface modification agent to modify the surface portions of the dielectric layer, under the electromagnetic field, the two surface portions of the dielectric layer can react with each other, thereby forming M-O-M bonds or M-N-M bonds to bring the two surface portions together. The seam between the two surface portions is thus eliminated. In addition, during the introduction of the surface modification agent and application of the electromagnetic field, the base structure may be kept at a relatively low temperature (e.g., not greater than about 650° C.). Furthermore, with provision of the stress layer on the dielectric layer, during application of the electromagnetic field, the temperature of the base structure may be further reduced. Therefore, the gap filling method of the present disclosure may be used for forming a seamless dielectric structure in the gap, and at the same time, performance of the semiconductor device manufactured using such gap filling method is well assured.

In accordance with some embodiments of the present disclosure, a method for filling a gap includes: filling a dielectric layer in the gap so that a seam is formed in the dielectric layer, the dielectric layer including two surface portions at two opposite sides of the seam, respectively; introducing a surface modification agent into the seam such that each of the two surface portions has first functional groups and second functional groups; forming a stress layer on the dielectric layer to cover the seam, the stress layer including a material different from that of the dielectric layer; and applying an energy field to permit the two surface portions to bond with each other through reaction between the first functional groups and the second functional groups.

In accordance with some embodiments of the present disclosure, prior to introducing the surface modification agent, the seam has a width between the two surface portions ranging from 5 Å to 1 nm.

In accordance with some embodiments of the present disclosure, the surface modification agent is introduced at a temperature ranging from room temperature to 450° C.

In accordance with some embodiments of the present disclosure, the stress layer has a coefficient of thermal expansion different from that of the dielectric layer such that a stress is generated between the stress layer and the dielectric layer.

In accordance with some embodiments of the present disclosure, the dielectric layer includes silicon oxide, silicon nitride, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof.

In accordance with some embodiments of the present disclosure, the stress layer includes amorphous silicon, silicon oxide, silicon nitride, silicon carbide, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof.

In accordance with some embodiments of the present disclosure, applying the energy field is performed by applying an electromagnetic field with a selective frequency such that the first functional groups on one of the two surface portions and the second functional groups on the other one of the two surface portions are capable of reacting with each other.

In accordance with some embodiments of the present disclosure, the selective frequency ranges from 100 kHz to 100 GHz.

In accordance with some embodiments of the present disclosure, during applying the energy field, the two surface portions are selectively heated such that a temperature at the two surface portions is higher than a temperature of the stress layer.

In accordance with some embodiments of the present disclosure, a method for filling a gap includes: filling a dielectric layer in the gap by atomic layer deposition, so that a seam is formed in the dielectric layer, the dielectric layer including two surface portions at two opposite sides of the seam, respectively; introducing a surface modification agent into the seam such that each of the two surface portions has first functional groups and second functional groups; forming a stress layer on the dielectric layer to cover the seam, the stress layer including a material different from that of the dielectric layer; and applying an energy field to permit the two surface portions to bond with each other through reaction between the first functional groups and the second functional groups.

In accordance with some embodiments of the present disclosure, both the first functional groups and the second functional groups are —OH groups, and the two surface portions are bonded with each other through dehydration of the —OH groups respectively on the two surface portions.

In accordance with some embodiments of the present disclosure, the first functional groups are —NH$_x$ groups, where x is 1 or 2, and the second functional groups are —H groups. The two surface portions are bonded with each other through dehydrogenation of the —NH$_x$ groups on one of the two surface portions and the —H groups on the other one of the two surface portions.

In accordance with some embodiments of the present disclosure, the surface modification agent includes gas molecules having a molecular size less than a width of the seam, and is introduced into the seam by immersing the dielectric layer in the atmosphere of the gas molecules.

In accordance with some embodiments of the present disclosure, the surface modification agent is introduced at a pressure ranging from 1 atm to 10 atm.

In accordance with some embodiments of the present disclosure, the gas molecules include water steam or hydrogen peroxide. After applying the energy field, the two surface portions are bonded together by M-O-M bonds, where M is silicon, boron or a metal element, and O is oxygen.

In accordance with some embodiments of the present disclosure, the gas molecules includes ammonia or hydrazine. After applying the energy field, the two surface portions are bonded together by M-N-M bonds, where M is silicon, boron or a metal element, and N is nitrogen.

In accordance with some embodiments of the present disclosure, the surface modification agent includes a plasma.

In accordance with some embodiments of the present disclosure, a precursor gas for generating the plasma includes hydrogen gas, nitrogen gas, oxygen gas, ammonia gas, or combinations thereof.

In accordance with some embodiments of the present disclosure, a method for filling a gap includes: filling a dielectric layer in the gap by atomic layer deposition, so that a seam is formed in the dielectric layer, the dielectric layer including two surface portions at two opposite sides of the seam, respectively; introducing a surface modification agent into the seam such that each of the two surface portions has first functional groups and second functional groups; and applying an energy field to permit the two surface portions to bond with each other through reaction between the first functional groups and the second functional groups.

In accordance with some embodiments of the present disclosure, prior to applying the energy field, the method further includes: forming a stress layer on the dielectric layer to cover the seam, the stress layer having a coefficient of thermal expansion different from that of the dielectric layer such that a stress is generated between the stress layer and the dielectric layer; and removing the stress layer after applying the energy field.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for filling a gap, comprising:
    filling a dielectric layer in the gap so that a seam is formed in the dielectric layer, the dielectric layer including two surface portions at two opposite sides of the seam, respectively;
    introducing a surface modification agent into the seam such that each of the two surface portions has first functional groups and second functional groups;
    forming a stress layer on the dielectric layer to cover the seam, the stress layer including a material different from that of the dielectric layer; and
    applying an energy field to permit the two surface portions to bond with each other through reaction between the first functional groups and the second functional groups.

2. The method as claimed in claim 1, wherein prior to introducing the surface modification agent, the seam has a width between the two surface portions ranging from 5 Å to 1 nm.

3. The method as claimed in claim 1, wherein the surface modification agent is introduced at a temperature ranging from room temperature to 450° C.

4. The method as claimed in claim 1, wherein the stress layer has a coefficient of thermal expansion different from that of the dielectric layer such that a stress is generated between the stress layer and the dielectric layer.

5. The method as claimed in claim 1, wherein the dielectric layer includes silicon oxide, silicon nitride, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof.

6. The method as claimed in claim 5, wherein the stress layer includes amorphous silicon, silicon oxide, silicon nitride, silicon carbide, silicon oxynitride, silicon oxycarbide, silicon carbon nitride, silicon oxycarbon nitride, boron nitride, metal oxide, metal nitride, metal oxynitride, metal oxycarbide, metal carbon nitride, metal oxycarbon nitride, or combinations thereof.

7. The method as claimed in claim 1, wherein applying the energy field is performed by applying an electromagnetic field with a selective frequency such that the first functional groups on one of the two surface portions and the second functional groups on the other one of the two surface portions are capable of reacting with each other.

8. The method as claimed in claim 7, wherein the selective frequency ranges from 100 kHz to 100 GHz.

9. The method as claimed in claim 1, wherein during applying the energy field, the two surface portions are selectively heated such that a temperature at the two surface portions is higher than a temperature of the stress layer.

10. A method for filling a gap, comprising:
    filling a dielectric layer in the gap by atomic layer deposition, so that a seam is formed in the dielectric layer, the dielectric layer including two surface portions at two opposite sides of the seam, respectively;
    introducing a surface modification agent into the seam such that each of the two surface portions has first functional groups and second functional groups;
    forming a stress layer on the dielectric layer to cover the seam, the stress layer including a material different from that of the dielectric layer; and
    applying an energy field to permit the two surface portions to bond with each other through reaction between the first functional groups and the second functional groups.

11. The method as claimed in claim 10, wherein both the first functional groups and the second functional groups are —OH groups, and the two surface portions are bonded with each other through dehydration of the —OH groups respectively on the two surface portions.

12. The method as claimed in claim 10, wherein:
    the first functional groups are —$NH_x$ groups, where x is 1 or 2;
    the second functional groups are —H groups;
    the two surface portions are bonded with each other through dehydrogenation of the —$NH_x$ groups on one of the two surface portions and the —H groups on the other one of the two surface portions.

13. The method as claimed in claim 10, wherein the surface modification agent includes gas molecules having a molecular size less than a width of the seam, and is introduced into the seam by immersing the dielectric layer in the atmosphere of the gas molecules.

14. The method as claimed in claim 13, wherein the surface modification agent is introduced at a pressure ranging from 1 atm to 10 atm.

15. The method as claimed in claim 13, wherein:
    the gas molecules include water steam or hydrogen peroxide; and
    after applying the energy field, the two surface portions are bonded together by M-O-M bonds, where M is silicon, boron, or a metal element, and O is oxygen.

16. The method as claimed in claim 13, wherein:
    the gas molecules includes ammonia or hydrozine; and
    after applying the energy field, the two surface portions are bonded together by M-N-M bonds, where M is silicon, boron or a metal element, and Nis nitrogen.

17. The method as claimed in claim 10, wherein the surface modification agent includes a plasma.

18. The method as claimed in claim 17, wherein a precursor gas for generating the plasma includes hydrogen gas, nitrogen gas, oxygen gas, ammonia gas, or combinations thereof.

19. A method for filling a gap, comprising:
    filling a dielectric layer in the gap by atomic layer deposition, so that a seam is formed in the dielectric layer, the dielectric layer including two surface portions at two opposite sides of the seam, respectively;

introducing a surface modification agent into the seam such that each of the two surface portions has first functional groups and second functional groups; and applying an energy field to permit the two surface portions to bond with each other through reaction between the first functional groups and the second functional groups.

20. The method as claimed in claim 19, prior to applying the energy field, further comprising:

forming a stress layer on the dielectric layer to cover the seam, the stress layer having a coefficient of thermal expansion different from that of the dielectric layer such that a stress is generated between the stress layer and the dielectric layer; and removing the stress layer after applying the energy field.

* * * * *